United States Patent

Jang et al.

[11] Patent Number: 6,037,018
[45] Date of Patent: Mar. 14, 2000

[54] SHALLOW TRENCH ISOLATION FILLED BY HIGH DENSITY PLASMA CHEMICAL VAPOR DEPOSITION

[75] Inventors: Syun-Ming Jang, Hsin-Chu; Chu-Yun Fu, Taipei; Chen-Hua Douglas Yu, Hsin-Chu, all of Taiwan

[73] Assignee: Taiwan Semiconductor Maufacturing Company, Hsin-Chu, Taiwan

[21] Appl. No.: 09/108,866

[22] Filed: Jul. 1, 1998

[51] Int. Cl.$^7$ .............................. B05D 3/06; H01L 21/76
[52] U.S. Cl. ................ 427/579; 427/255.37; 427/255.7; 427/419.3; 438/424; 438/435; 438/221; 438/296
[58] Field of Search .................... 427/579, 255.7, 427/255.37, 255.18, 419.3; 438/424, 435, 221, 296

[56] References Cited

U.S. PATENT DOCUMENTS

| | | | |
|---|---|---|---|
| 5,116,779 | 5/1992 | Iguchi | 437/67 |
| 5,614,055 | 3/1997 | Fairbairn et al. | 156/345 |
| 5,621,241 | 4/1997 | Jain | 257/632 |
| 5,677,231 | 10/1997 | Maniar et al. | 437/67 |
| 5,726,090 | 3/1998 | Jang et al. | 438/435 |
| 5,731,241 | 3/1998 | Jang et al. | 438/424 |
| 5,786,262 | 7/1998 | Jang et al. | 438/424 |
| 5,817,567 | 10/1998 | Jang et al. | 438/427 |
| 5,837,612 | 11/1998 | Ajaria et al. | 438/697 |
| 5,895,254 | 4/1999 | Huang et al. | 438/424 |

OTHER PUBLICATIONS

Snag et al. "Comparative Evaluation of Gap–Fill Dielectrics in Shallow Trench Isolation for Sub 0.25μm Technologies" IEDM, '96, p. 841–844.

*Primary Examiner*—Roy V. King
*Attorney, Agent, or Firm*—George O. Saile; Stephen B. Ackerman; William J. Stoffel

[57] ABSTRACT

A method for filling shallow trenches 28 with a HDPCVD oxide 50. The invention has two liners: (a) a thermal oxide liner 36 and (b) an overlying conformal $O_3$-TEOS protective liner 40. The $O_3$-TEOS protective liner 40 prevents the HDPCVD oxide 50 from sputter damaging the trench sidewalls and the masking layer 24. The $O_3$-TEOS layer has novel process temperature (400 to 560° C.) and low pressure (40 to 80 torr) that allows the $O_3$-TEOS layer to deposit uniformly over thermal oxide liner 36. The method begins by forming pad oxide layer 20 and a barrier layer 24 over a substrate. A trench 28 is formed in the substrate 10 through the pad oxide layer 20 and the barrier layer 24. A thermal oxide liner 36 and a protective $O_3$-TEOS liner layer 40 are formed over the walls of the trench 28 and over the barrier layer 24. Lastly, a high density plasma chemical vapor deposition (HDPCVD) oxide layer 50 is formed over the protective liner layer 40 filling the trench 28.

18 Claims, 2 Drawing Sheets

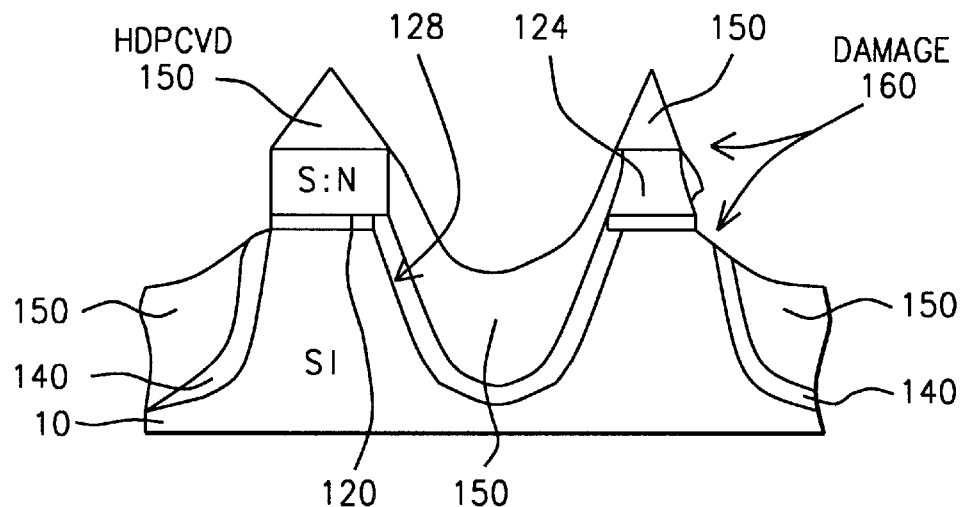
*FIG. 1A – Prior Art*
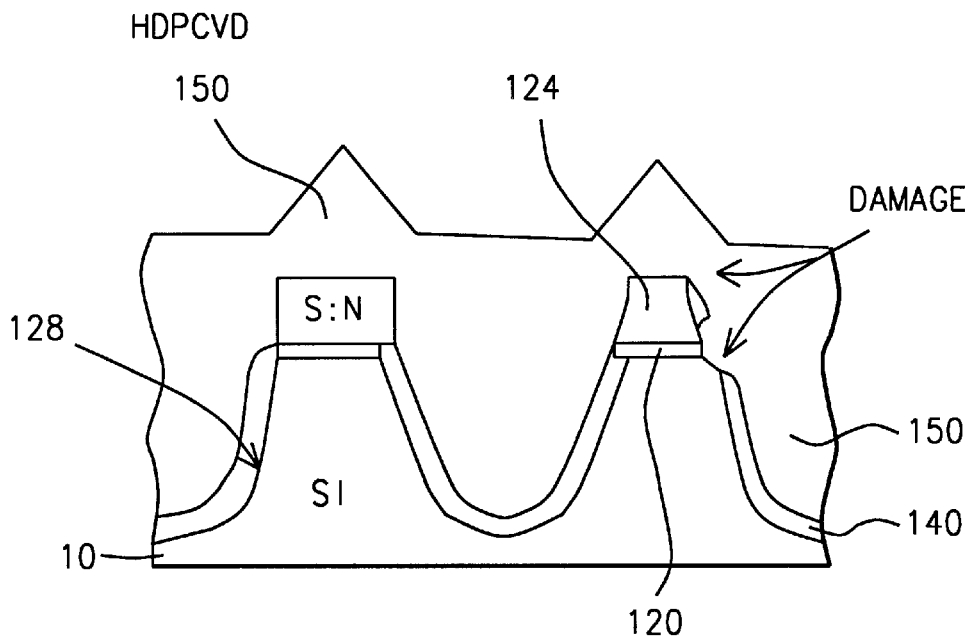
*FIG. 1B – Prior Art*

SHALLOW TRENCH ISOLATION FILLED BY HIGH DENSITY PLASMA CHEMICAL VAPOR DEPOSITION

This application is related to Ser. No. 09/086,770 filed on May 29, 1998, by inventors S. M. Jang and C. H. Yu, to the same assignee, entitled: Ozone-TEOS Method For Forming With Attenuated Surface Sensitivity A Silicon Oxide Dielectric Layer Upon A Thermally Oxidized Silicon Substrate Layer.

BACKGROUND OF THE INVENTION

1) Field of the Invention

This invention relates generally to fabrication of isolation regions in semiconductor devices and more particularly to a method for forming shallow trench isolation (STI) regions having protective oxide liner layers on the trench walls.

2) Description of the Prior Art

There is a challenge to develop new processes to shrink the size of Semiconductor devices. For many years the local oxidation isolation method (LOCOS) and buffered LOCOS method were used to form oxide isolation regions between active areas on a substrate. As device dimensions are scaled down into the submicron regime, the LOCOS processes develop problems from the bird's beak. No matter how the LOCOS processes are modified, the bird beak will limit the devices.

Therefore in sub-quarter micron technology, a new isolation with a totally flat surface called the shallow trench isolation (STI) is used. In shallow trench isolation (STI), a trench is etched into the substrate and a chemical vapor deposition oxide is deposited on the wafer surface and etch back so that the trench is filled.

The inventor has experimented with various methods to improve the STI process. The inventor has found that when a HDPCVD oxide is deposited in the trench that the trench wall and other underlying dielectric layers are damaged by Ar sputtering (from the HDPCVD process). Moreover, the HDPCVD trench fill layer often contains metal contaminates the cause device fails. For these reasons HDPCVD layers are used over metal lines in upper layers, but not in STI applications. HDPCVD has superior trench filling capabilities (ability to fill in very small width trenches) compared to other processes such as low pressure chemical vapor deposition (LPCVD), sub atmospheric chemical vapor deposition (SACVD), Hydrogen-Silsesquioxane spin-on-glass (HSQ-SOG), etc. Therefore, there is a need to develop a STI process using HDPCVD oxide that (1) does not damage the Substrate sidewalls and the SiN masking layer, and (2) allows sub 0.5 micron dimension trench filling.

The importance of overcoming the various deficiencies noted above is evidenced by the extensive technological development directed to the subject, as documented by the relevant patent and technical literature. The closest and apparently more relevant technical developments in the patent literature can be gleaned by considering U.S. Pat. No. 5,614,055 (Fairbairn) that shows a High density plasma CVD and etching reactor that can be used for STI filling. U.S. Pat. No. 5,677,231(Maniar) teaches a trench isolation region (32) that is fabricated to include a trench liner (28) comprised of aluminum nitride. U.S. Pat. No. 5,621,241 (Jain) shows a trench filling HDP-$SiO_2$ and CMP method of filling between conductive lines. U.S. Pat. No. 5,116,779 (Iguchi) shows a STI fill process including an oxide and nitride liners.

Nag et al., Comparative Evaluation Of Gap-Fill Dielectrics In STI For Sub-0.25 $\mu$M Technologies, IEDM 96- pp. 841 to 844 discusses ICP HDP CVD trench fill techniques.

SUMMARY OF THE INVENTION

It is an object of the present invention to provide a method for fabricating a shallow trench isolation (STI) regions that can be filled by a HDPCVD oxide without damaging the trench sidewall.

It is an object of the present invention to provide a method for fabricating a STI regions having two liners (1) thermal oxide 36 and (2) an $O_3$-TEOS liner layer 40; and a HDPCVD trench-fill layer 50.

It is in object of the present invention to provide a method for fabricating a shallow trench isolation (STI) regions that can be filled by a high sputter HDPCVD oxide 50 without damaging the trench sidewall and SiN mask 24; and without degrading the trench fill capabilities.

It is in object of the present invention to provide a method for fabricating a shallow trench isolation (STI) regions that can be filled by a HDPCVD oxide using a $O_3$-TEOS liner that protects the trench sidewalls from ion bombardment damage and does not block the trench thus allowing the HDPCVD oxide to fill narrow trenches (superior trench fill capabilities).

It is an object of the present invention to provide a method for fabricating a STI regions having an $O_3$-TEOS liner layer and a HDPVCD trench-fill layer. which is low cost, and relatively easy to manufacture.

It is an object of the present invention to provide a method for fabricating a STI regions having a protective $O_3$-TEOS liner layer 40 that is densified so that protective liner 40 has about the same wet etch rate as the HDPCVD trench-fill layer 50.

To accomplish the above objectives, the present invention provides a method of fabricating a HDPCVD oxide 50 filled shallow trench isolation. The invention has two liners: (a) a thermal oxide line 36 and (b) an overlying conformal $O_3$-TEOS protective liner 40.

The protective liner 40 prevents the HDPCVD oxide 50 from sputter damaging the trench sidewalls or the masking layer 24. The $O_3$-TEOS layer has novel process temperature (460 to 560° C.) and low pressure (40 to 80 torr) that allows the $O_3$-TEOS layer to deposit uniformly over thermal oxide liner 36. In addition, the invention has a novel densification anneal step that gives the protective $O_3$-TEOS liner 40 the same etch rate of the HDPCVD oxide layer 50.

The invention comprising the steps of:
  a) forming pad oxide layer 20 over a semiconductor substrate 10;
  b) forming a barrier layer 24 over the pad oxide layer 20;
  c) forming a trench 28 in the semiconductor substrate 20 through the pad oxide layer 20 and the barrier layer 24; the trench 28 having sidewalls and a bottom;
  d) forming a thermal oxide layer 36 over the sidewalls and bottom of said trench; The thermal oxide layer 36 having a thickness between about 150 and 400 Å;
  e) forming a protective liner layer 40 over the sidewalls and the bottom of the trench 28 and over the barrier layer 24; the protective liner layer composed of silicon oxide formed by a low-pressure $O_3$-TEOS or low $O_3$ concentration $O_3$-TEOS process;

(e1) The $O_3$-TEOS layer 40 is formed at about 400° C., 60 torr, thickness between 300 and 1000 Å; - This process reduces the surface sensitivity of the layer 40 and allows $O_3$-TEOS to be deposited on the thermal oxide 36 without thickness loss (due to surface sensitivity).

(e2) After the protective layer 40 is deposited, it is densified at 1000° C. in $N_2$ for about 2 hours. This gives the $O_3$ TEOS protective layer 40 about the same etch rate as the HDPCVD oxide layer 50.

f) forming an oxide layer 50 using a HDPCVD process over the protective liner layer filling the trench 28.

The preferred $O_3$-TEOS protective liner layer 40 is formed at a temperature of about 480° C., at a pressure of about 60 Torr and is densified at 1000° C. for about 2 hours.

BENEFITS OF THE INVENTION

The present invention provides a method for fabricating a shallow trench isolation (STI) regions that can be filled by a HDPCVD oxide following deposition of an $O_3$-TEOS protective liner 40. The invention's process has the following advantages:

(1) The conformal $O_3$ TEOS liner 40 protects the trench sidewalls, active areas and barrier layer 124 from ion bombardment damage from the high sputter HDPCVD oxide trench fill layer 50.

(2) The $O_3$-TEOS liner does not block the trench 28 thus allowing the HDPCVD oxide to fill narrow trenches (superior trench fill capabilities).

(3) The $O_3$-TEOS liner 40 is a thermal process and does not damage the silicon sidewalls with plasma bombardment.

(4) The $O_3$-TEOS liner has a very low metal contamination level and therefore reduces metal contamination.

(5) The wet etch rate of $O_3$-TEOS after densification is about equal to the wet etch rate of as deposited HDPCVD oxide (compared to ~1.45 ratio of HDPCVD oxide to thermal oxide.)

Additional objects and advantages of the invention will be set forth in the description that follows, and in part will be obvious from the description, or may be learned by practice of the invention. The objects and advantages of the invention may be realized and obtained by means of instrumentalities and combinations particularly pointed out in the append claims.

BRIEF DESCRIPTION OF THE DRAWINGS

The features and advantages of a semiconductor device according to the present invention and farther details of a process of fabricating such a semiconductor device in accordance with the present invention will be more clearly understood from the following description taken in conjunction with the accompanying drawings in which like reference numerals designate similar or corresponding elements, regions and portions and in which:

FIGS. 1A and 1B are cross sectional views for illustrating a method for manufacturing a shallow trench isolation (STI) region according to the prior art.

DETAILED DESCRIPTION OF THE PREFERRED EMBODIMENTS

Figure 2A:
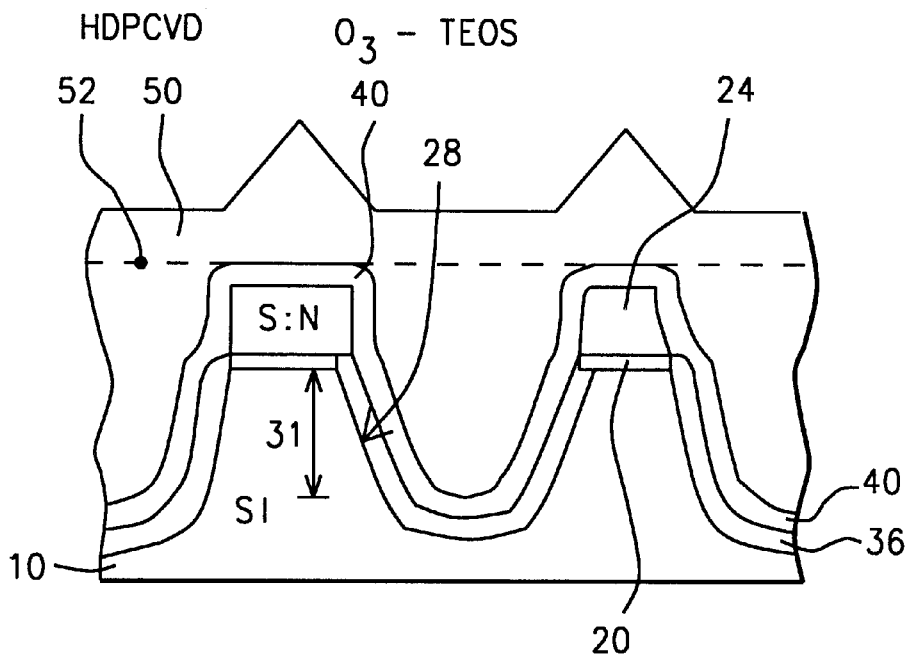
FIGS. 2A and 2B are cross sectional views for illustrating a method for manufacturing a shallow trench isolation (STI) region according to the present invention.

The present invention will be described in detail with reference to the accompanying drawings. The present invention provides a method of forming a shallow trench isolation (STI) region having two liners: (1) thermal oxide liner 36 and (2) a novel $O_3$-TEOS liner 40, and a HDPCVD oxide trench-fill layer 50.

In the following description numerous specific details are set forth such as flow rates, pressure settings, thicknesses, etc., in order to provide a more thorough understanding of the present invention. It will be obvious, however, to one skilled in the art that the present invention may be practiced without these details. In other instances, well know process have not be described in detail in order to not unnecessarily obscure the present invention.

It should be recognized that many publications describe the details of common techniques used in the fabrication process of integrated circuit components. See, E.g., C. Y. Chang, S. M. Sze, in *ULSI Technology*, by The McGraw-Hill Company, Inc. copyright 1997. Those techniques can be generally employed in the fabrication of the structure of the present invention. Moreover, the individual steps of such a process can be performed using commercially available integrated circuit fabrication machines. As specifically necessary to an understanding of the present invention, exemplary technical data are set forth based upon current technology. Future developments in the art may call for appropriate adjustments as would be obvious to one skilled in the art.

It should be will understood by one skilled in the art that by including additional process steps not described in this embodiment, other types of devices can also be included on the chip. It should also be understood that the figures depict only one STI isolation region out of a multitude of regions that are fabricated simultaneously on the substrate.

A. Problems with Prior Art Practices

FIGS. 1A and 1B show the problems the inventor experiences with his previous HDPCVD oxide trench fill process. FIG. 1A shows a substrate 10 having a trenches 128 defined by an oxide layer 120 and silicon nitride (SiN) barrier layer 120. The trench is covered by a thermal oxide liner 140. Next, a HDPCVD oxide layer 150 is formed thereover. The HDPCVD process is a combination deposition and sputter etch (e.g., Ar damage) process. The deposition to Sputter (D/S) ratio is important. The inventor has found the following problem. FIG. 1A shown the HPDCVD layer partially filling the trenches. During the Deposition/sputtering HPDCVD process, the substrate trench 128 corners, oxide layer 120, and SiN layer 124 get damaged 160 by the HDPCVD sputtering process.

FIG. 1B shows the HPDCVD oxide deposition 150 process completed, but with the damage 160 done to the SiN layer and trench sidewalls. Eliminating this damage 160 that the inventor has found, is the purpose of this invention.

B. Overview of Invention

TABLE

Summary of the Invention

| Layer | Invention | advantages |
|---|---|---|
| Liner 1 - on substrate | thermal oxide - 36 | |
| Liner 2 - on liner 1 | KEY -- O3-TEOS protection layer 40 | *more conformal than LPTEOS so Invention's HPDCVD layer 50 has better trench gap fill<br>*The low pressure and high temperature process allows the $O_3$-TEOS layer to evenly deposit over the thermal oxide layer 36 |
| Densification process | Anneal Layer 40 At 60 Torr, 480° C. in $N_2$, so wet etch rate of layer 40 and HDPCVD layer 50 are the equal | |
| Trench fill | Hi sputter HDPCVD oxide 50 | Won't damage substrate or SiN because of $O_3$ - TEOS liner 40 |

C. Pad Oxide Layer 20 and Barrier Layer 24

Referring to FIG. 1, a pad oxide layer 20 is formed over a semiconductor substrate 10. The pad oxide layer 20 preferably has a thickness in a range of between about 100 and 150 Å. The semiconductor substrate 10 is understood to possibly include a semiconductor wafer, active and passive devices formed within the wafer and layers formed on the wafer surface. The substrate is preferably a silicon semiconductor wafer having a p-type impurity with a (1,0,0) orientation.

As shown in FIG. 1, a barrier layer 24 is formed over the pad oxide layer 20. The barrier layer is preferably composed of silicon nitride and has a thickness in a range of between about 1000 and 2000 Å.

A trench 28 is formed in the semiconductor substrate 20 through the pad oxide layer 20 and the barrier layer 24. The trench is formed using a resist layer (not shown) to pattern the pad oxide layer 20 and the barrier layer 24 (masking layer). The trench 28 is etched in the substrate through openings in the resist layer. The resist layer is then removed.

The trench 28 preferably has sidewalls and a bottom. The trench preferably has a depth 31 in a range of between about 3000 and 5000 Å; and a width in a range of between about 0.2 and 1.2 μm.

D. Thermal Oxide Liner 36

Next, we form a thermal oxide layer 36 over the bottom and sidewalls of the trench 28. The thermal oxide can be formed using a dry or wet oxidation process. The thermal oxide layer 36. The thermal oxide layer preferably has a thickness in a range of between about 150 and 400 Å.

The thermal liner 36 is preferably formed employing a thermal oxidation method employing a temperature of from about 850 to about 1000 degrees centigrade for a time period of at least about 20 minutes (preferably from about 20 to about 40 minutes) to form the thermal silicon oxide dielectric layer 12 of thickness at least about 150 angstroms (preferably from about 150 to about 400 angstroms) over the substrate 10.

E. Protective $O_3$-TEOS Liner 40

In an important step, a conformal $O_3$-TEOS protection layer 40 (e.g., trench liner layer) is formed over the sidewalls and the bottom of the trench 28 and over the pad oxide and barrier layer 24. The protective liner layer 40 is preferably composed of silicon oxide formed preferably by an $O_3$-TEOS low-pressure chemical vapor deposition process (no plasma activation). The protective liner layer preferably has a thickness in a range of between about 300 and 1000 Å. The $O_3$-TEOS layer has novel process temperature between about 400 to 560° C., and low pressure (40 to 80 torr) that allows the $O_3$-TEOS layer to deposit uniformly over thermal oxide liner 36.

TABLE thermal low pressure $O_3$ - TEOS process - Preferred process parameters

| LPCVD SACVD | units | Low | tgt | hi |
|---|---|---|---|---|
| Thickness | Å | 300 | | 1000 |
| Reactant gasses $O_3$ | sccm | 4000 | 5000 | 6000 |
| He (Carrier gas) | sccm | 3200 | 4000 | 4800 |
| TEOS | mgm (milligrams per m³ in carrier gas (He) flow) | 380 | 475 | 570 |
| pressure | torr | 48 | 60 | 72 |
| temperature | C.° | 400 | 480 | 560 |
| Densification process Temperature | C.° | 900 | 1000 | 1100 |
| Densification process Time | hours | 1.6 | 2 | 2.4 |
| Densification environment-($N_2$) | | | Nitrogen | |
| Wet etch rate ratio to thermal oxide | | 1.40 | 1.45 | 1.50 |

A second preferred $O_3$-TEOS process of forming the liner 40 employs an ozone-TEOS thermal chemical vapor deposition (CVD) method at a reactor chamber pressure of from about 40 to about 80 torr, without plasma activation. Preferably, the ozone-TEOS thermal chemical vapor deposition (CVD) method also employs: (1) a substrate temperature of from about 400 to about 560 degrees centigrade; (2) a tetraethylorthosilicate (TEOS) concentration of from about 300 to about 600 milligrams per cubic meter in a helium or nitrogen carrier gas flow of from about 3000 to about 5000 standard cubic centimeters per minute (sccm)—and (3) an ozone concentration of from about 10 to about 15 weight percent in an oxygen carrier gas flow of from about 4000 to about 6000 standard cubic centimeters per minute (sccm).

The liner 40 formed employing an ozone-TEOS thermal chemical vapor deposition (CVD) method in accord with the method of the present invention exhibits: (1) enhanced gap filling properties—(2) enhanced bulk properties; and (3) an attenuated surface sensitivity with respect to a thermal silicon oxide substrate layer, such as the thermal silicon oxide dielectric layer 36, in comparison with silicon oxide dielectric layers formed employing ozone-TEOS thermal chemical vapor deposition (CVD) methods which typically employ a reactor chamber pressure of from about 400 to about 760 torr and a substrate temperature of from about 350 to about 400 degrees centigrade.

Within the present invention, it is believed that the generally decreased reactor chamber pressure within the ozone-TEOS thermal chemical vapor deposition (CVD) method of the present invention provides primarily the attenuated surface sensitivity of silicon oxide dielectric layers formed employing the method of the present invention upon thermally oxidized silicon substrate layers, while secondarily contributing synergistically with increased substrate temperatures to improved bulk properties (such as gap-filling properties) of the silicon oxide dielectric layers formed employing the method of the present invention. Similarly, the generally increased substrate temperatures employed when forming silicon oxide dielectric layers employing the ozone-TEOS thermal chemical vapor deposition (CVD) method of the present invention are believed to primarily provide in synergistic conjunction with the generally decreased reactor chamber pressures the enhanced bulk properties of silicon oxide dielectric layers formed in accord with the method of the present invention. Finally, the generally increased tetraethylorthosilicate (TEOS) concentrations employed within carrier gases employed within the ozone-TEOS, thermal chemical vapor deposition (CVD) method of the present invention provide generally increased microelectronics fabrication throughout in comparison with ozone-TEOS thermal chemical vapor deposition (CVD) methods as are more conventional in the art and employ lower tetraethylorthosilicate (TEOS) concentration within their gas flows.

F. Oxide Layer 50 Using a HDPCVD Process

A high density plasma chemical vapor deposition (HDPCVD) oxide layer 50 (or ICP HPDCVD) is formed over the protective liner layer filling the trench 28. The HDPCVD oxide layer 50 is preferably formed of silicon oxide formed using a HDPCVD process shown in the table below:

TABLE

Preferred process parameters HDPCVD oxide layer 50

|  | units | Low | tgt | hi |
|---|---|---|---|---|
| HDPCVD - hi sputter rate | (Å/min) | 1100 | 1300 | 1650 |
| Thickness | Å | 4800 | 6000 | 7200 |
| Deposit to sputter ratio |  | 5.5 | 6.0 | 6.5 |
| Reactant gasses $O_2$ | sccm | 215 | 268 | 320 |
| Reactant gasses $SiH_4$ | sccm | 105 | 131.5 | 158 |
| Ar flow rate | sccm | 100 | 126 | 150 |
| pressure | torr | 9 | 11 | 13 |
| temperature | C.° | 450 | 500 | 600 |

The HDPCVD process is a "high sputter Process" because the sputter rate is high and the D/S ratio is low. The HDPCVD process preferably has deposit to sputter ratio between 5.0 and 7.0.

Next, the HDPCVD layer 50 is planarized. FIG. 2A shows the surface of the HDPCVD layer 50 as formed. The layer is subsequently planarized has the flat surface (dashed line ) 52. Preferably the HDPCVD layer is planarized by a CMP process using the barrier layer 24 as a polish stop.

Figure 2B:
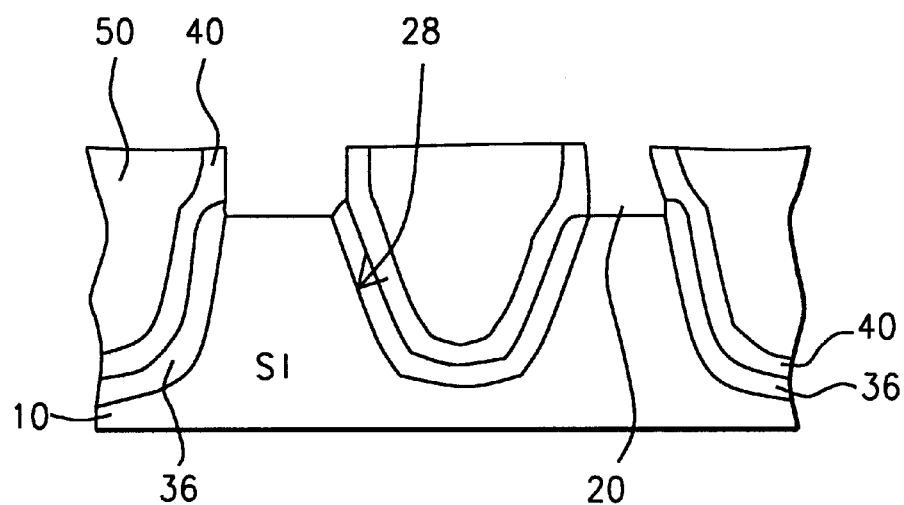

FIG. 2B shows the isolation region after the CMP of the HDPCVD layer and $O_3$-TEOS protective layer 40. The barrier layer 24 and pad oxide layer 20 are removed.

G. Disadvantages of the Alternate Processes

The use of Ar sputtering during deposition of trenching filling oxide 50 HDPCVD process is effective in gap-filling small geometries. However, the inventors have found many short comings of different protection (Liners) layers 40 and HDPCVD 50 gap-filling STI processes. The increase of Ar sputtering enhances gap-filling, it unfortunately removes other dielectrics as well, such as silicon nitride (SiN) and thermal oxide. A high sputtering component during the HDPCVD oxide 50 deposition will cause sputtering of trench sidewalls and high diode leakage.

As an alternate to the invention's $O_3$-TEOS protective (liner) layer 40, the inventor evaluated the use of a PECVD liner layer by applying zero bias power in the initial stage of HDPCVD. However, the inventor found the use of zero bias power in the initial stage of HDPCVD, which formed a PECVD oxide liner, helped lessen these HDPCVD removal problems. But the initial PECVD oxide liner may leave overhangs at the openings of trenches thereby hindering subsequent gap-filling by HDPCVD oxide layer.

In addition, the PECVD oxide liner (from the zero bias initial step), deposited on thermal oxide (e.g., 36) may damage devices.

Also, the PECVD oxide underlayer may contain impurities (e.g., metals) that may damage the devices. The PECVD layer is impure because impurities come from the plasma sputter sidewalls.

H. Differences between the Invention's $O_3$ TEOS Protective Layer 40 and Liners of the PRIOR Art.

The process of the present invention differs from the any prior art processes that use only conventional LPTEOS liners. The invention's $O_3$-TEOS protective liner 36 is not a conventional process arid the invention's $O_3$ TEOS liner provides advantages of other protective liners. First, the $O_3$-TEOS layer 40 is formed at about 400° C., 60 torr, thickness between 300 and 1000 Å. This process specifically reduces the surface sensitivity of the layer 40. This allows the $O_3$-TEOS 40 to be deposited on the thermal oxide layer 36 without thickness loss (due to surface sensitivity). Also, the invention's $O_3$-TEOS process is a very conformal process (much more conformal than typical LPTEOS processes. Therefore the invention's $O_3$-TEOS 40 and HPDCVD layer 50 better gap fill in tight trenches that the prior art, especially LPTEOS liner layers.

Another important process is the densification of the $O_3$-TEOS protective layer. After the protective layer 40 is deposited, it is densified at 1000° C. in $N_2$ for about 2 hours. This gives the $O_3$-TEOS protective layer 40 about the same etch rate as the HDPCVD oxide layer 50. This is important for subsequent etch process and preserves the isolation layer 40 50.

I. Benefits of the Invention's Protective Liner Layer 40

The present invention provides a method for fabricating a shallow trench isolation (STI) regions that can be filled by a HDPCVD oxide using a $O_3$-TEOS liner 40. The invention's process has the following advantages:

1) The liner 40 protects the trench sidewalls and active areas from ion bombardment damage from the high sputter HDPCVD oxide trench fill layer 50.

2) The $O_3$-TEOS liner does not block the trench 28 thus allowing the HDPCVD oxide to fill narrow trenches (superior trench fill capabilities).

3) The liner 40 is a thermal process and does not damage the silicon sidewalls with plasma bombardment.

4) The $O_3$-TEOS liner has a very low metal contamination level and therefore reduces metal contamination.

5) The wet etch rate of $O_3$-TEOS is about equal the wet etch rate of HDPCVD oxide (compared to ~1.45 ratio of thermal oxide to HDPCVD oxide.)

The invention's LP-TEOS (or SACVD $O_3$-TEOS) protection (liner or under-layer) layer 40 is that it is more conformal than a PECVD silane oxide liner layer without bias power, leading to better gap-filling. Additionally, the purer and thermally grown $O_3$-TEOS (or SACVD $O_3$-TEOS) line layer 40 is superior to PECVD silane oxide liner in forming shallow trench isolation (STI) because the invention's $O_3$-TEOS protective liner layer 40 does not damage the trench sidewall with plasma damage.

While the invention has been particularly shown and described with reference to the preferred embodiments thereof, it will be understood by those skilled in the art that various changes in form and details may be made without departing from the spirit and scope of the invention.

What is claimed is:

1. A method of fabricating a HDPCVD oxide filled shallow trench isolation comprising the steps of:
    a) forming a pad oxide layer over a semiconductor substrate;
    b) forming a barrier layer over said pad oxide layer;
    c) forming a trench in said semiconductor substrate through said pad oxide layer and said barrier layer; said trench having sidewalls and a bottom;
    d) forming a thermal oxide layer over said sidewalls and said bottom of said trench;
    e) forming a protective liner layer on said thermal oxide layer and over said barrier layer; said protective liner layer being composed of silicon oxide formed by an $O_3$-TEOS process at a temperature between 400 and 560° C.;
    f) forming an oxide layer using a HDPCVD process over said protective liner layer filling said trench.

2. The method of claim 1 wherein said pad oxide layer has a thickness in a range of between about 100 and 150 Å; said barrier layer is composed of silicon nitride and having a thickness in a range of between about 1000 and 2000 Å.

3. The method of claim 1 wherein said trench having a depth in a range of between about 3000 and 5000 Å and a width in a range of between about 0.2 μm and 1.2 μm.

4. The method of claim 1 wherein said thermal oxide layer is formed with a thermal oxidation process at a temperature between about 850 and about 1000 degrees centigrade for a time period from about 20 to about 40 minutes and said thermal oxide layer having a thickness in a range of between about 150 and 400 Å.

5. The method of claim 1 wherein said protective liner layer having a thickness in a range of between about 300 and 1000 Å.

6. The method of claim 1 wherein said protective liner layer is formed using a LPCVD process having a $O_3$ flow rate between about 4000 and 6000 sccm, a TEOS flow rate between 380 and 570 mgm in a He flow rate between 3200 and 4800 sccm, and a pressure between 48 and 72 torr.

7. The method of claim 1 wherein said protective liner layer formed using LPCVD process having a $O_3$ flow rate between about 4000 and 6000 sccm, a TEOS flow rate between 380 and 570 mgm in a He flow rate between 3200 and 4800 sccm; a pressure between 48 and 72 torr; then densifying said protective liner layer at a temperature between 900 and 1100° C. for a time between about 1.6 and 2.4 hours; and in a $N_2$ environment.

8. The method of claim 1 wherein said oxide layer having a thickness in a range of between about 4800 and 7200 Å.

9. The method of claim 1 wherein said oxide layer is formed using a HDPCVD process comprising: a HDPCVD-sputter rate between about 1100 and 1650 Å/min; deposit to sputter ratio between 5.5 and 6.5; an $O_2$ flow between 215 and 320 sccm; a $SiH_4$ gas flow between 105 and 158 sccm; an Ar flow rate between 100 and 150 sccm; at a pressure between 9 and 13 torr and at a temperature between 450 and 600° C.

10. A method of fabricating a HDPCVD oxide filled shallow trench isolation comprising the steps of:
    a) forming pad oxide layer over a semiconductor substrate;
    b) forming a barrier layer over said pad oxide layer;
    c) forming a trench in said semiconductor substrate through said pad oxide layer and said barrier layer; said trench having sidewalls and a bottom;
    d) forming a thermal oxide layer over said sidewalls and said bottom of said trench;
    e) forming a protective liner layer on said thermal oxide layer and over said barrier layer; said protective liner layer is composed of silicon oxide formed by a $O_3$-TEOS process;
        (e1) said protective liner layer is formed using a LPCVD process at a pressure between 48 and 72 torr; a temperature between 400 and 560° C.;
    f) forming an oxide layer using a HDPCVD process over said protective liner layer filling said trench;
        (f1) said oxide layer is formed using a HDPCVD process comprising: a deposition to sputter ratio between 5.0 and 7.0.

11. The method of claim 10 wherein said pad oxide layer having a thickness in a range of between about 100 and 150 Å; and said barrier layer is composed of silicon nitride and having a thickness in a range of between about 1000 and 2000 Å.

12. The method of claim 10 wherein said trench having a depth in a range of between about 3000 and 5000 Å and a width in a range of between about 0.2 μm and 1.2 μm.

13. The method of claim 10 wherein said thermal oxide layer is formed with a thermal oxidation process a temperature between about 850 and about 1000 degrees centigrade for a time period from about 20 to about 40 minutes; said thermal oxide layer having a thickness in a range of between about 150 and 400 Å.

14. The method of claim 10 wherein said protective liner layer having a thickness in a range of between about 300 and 1000 Å.

15. The method of claim 10 wherein after said protective liner layer is formed, densifying said protective liner at a temperature between 900 and 1100° C. for a time between about 1.6 and 2.4 hours; and in a $N_2$ environment.

16. The method of claim 10 wherein said oxide layer having a thickness in a range of between about 4800 and 7200 Å; said oxide layer is formed using a HDPCVD process comprising a HDPCVD-sputter rate between about 1100 and 1650 Å/min; deposit to sputter ratio between 5.5 and 6.5; an $O_2$ flow between 215 and 320 sccm; a $SiH_4$ gas flow between 105 and 158 sccm; an Ar flow rate between 100 and 150 sccm; at a pressure between 9 and 13 torr and at a temperature between 450 and 600° C.

17. A method of fabricating a HDPCVD oxide filled shallow trench isolation comprising the steps of:

a) forming pad oxide layer over a semiconductor substrate;
b) forming a barrier layer over said pad oxide layer;
c) forming a trench in said semiconductor substrate through said pad oxide layer and said barrier layer; said trench having sidewalls and a bottom;
d) forming a thermal oxide layer over said sidewalls and said bottom of said trench;
e) forming a protective liner layer on said thermal oxide layer and over said barrier layer; said protective liner layer is composed of silicon oxide formed by a $O_3$-TEOS process;
  (e1) said protective liner layer having a thickness in a range of between about 300 and 1000 Å; said protective liner layer is formed using a LPCVD process having a $O_3$ flow rate between about 4000 and 6000 sccm, a TEOS flow rate between 380 and 570 mgm in a He flow rate between 3200 and 4800 sccm, a pressure between 48 and 72 torr; a temperature between 400 and 560° C.;
  (e2) after said protective liner layer is formed, densifying said protective liner at a temperature between 900 and 1100° C. for a time between about 1.6 and 2.4 hours; and in a $N_2$ environment;
f) forming an oxide layer using a HDPCVD process over said protective liner layer filling said trench 28;
  (f1) said oxide layer having a thickness in a range of between about 4800 and 7200 Å; said oxide layer is formed using a HDPCVD process comprising: a HDPCVD-sputter rate between about 1100 and 1650 Å/min; deposit to sputter ratio between 5.5 and 6.5; an $O_2$ flow between 215 and 320 sccm; a $SiH_4$ gas flow between 105 and 158 sccm; an Ar flow rate between 100 and 150 sccm; at a pressure between 9 and 13 torr and at a temperature between 450 and 600° C.

18. The method of claim 17 wherein said thermal oxide layer is formed with a thermal oxidation process at a temperature between about 850 and about 1000 degrees centigrade for a time period from about 20 to about 40 minutes; said thermal oxide layer having a thickness in a range of between about 150 and 400 Å.

* * * * *